United States Patent
Payne et al.

(10) Patent No.: US 10,577,567 B2
(45) Date of Patent: *Mar. 3, 2020

(54) CLEANING COMPOSITIONS FOR REMOVING POST ETCH RESIDUE

(71) Applicant: Entegris, Inc., Billerica, MA (US)

(72) Inventors: Makonnen Payne, White Plains, NY (US); Emanuel I. Cooper, Scarsdale, NY (US); WonLae Kim, Gyeonggi-do (KR); Eric Hong, Gyeonggi-do (KR); Sean Kim, Gyeonggi-do (KR)

(73) Assignee: Entegris, Inc., Billerica, MA (US)

(*) Notice: Subject to any disclaimer, the term of this patent is extended or adjusted under 35 U.S.C. 154(b) by 12 days.

This patent is subject to a terminal disclaimer.

(21) Appl. No.: 15/821,217

(22) Filed: Nov. 22, 2017

(65) Prior Publication Data

US 2018/0148669 A1 May 31, 2018

Related U.S. Application Data

(60) Provisional application No. 62/426,443, filed on Nov. 25, 2016.

(51) Int. Cl.

| | | |
|---|---|---|
| *C11D 7/32* | (2006.01) | |
| *C11D 3/33* | (2006.01) | |
| *C11D 7/36* | (2006.01) | |
| *C11D 3/00* | (2006.01) | |
| *G03F 7/42* | (2006.01) | |
| *C11D 11/00* | (2006.01) | |
| *C11D 1/62* | (2006.01) | |
| *C11D 3/06* | (2006.01) | |
| *C11D 3/20* | (2006.01) | |
| *C11D 3/28* | (2006.01) | |
| *C11D 3/39* | (2006.01) | |
| *C11D 3/43* | (2006.01) | |
| *H01L 21/02* | (2006.01) | |

(52) U.S. Cl.
CPC .................. *C11D 3/33* (2013.01); *C11D 1/62* (2013.01); *C11D 3/0073* (2013.01); *C11D 3/06* (2013.01); *C11D 3/2068* (2013.01); *C11D 3/2082* (2013.01); *C11D 3/28* (2013.01); *C11D 3/3942* (2013.01); *C11D 3/43* (2013.01); *C11D 7/3209* (2013.01); *C11D 7/36* (2013.01); *C11D 11/0047* (2013.01); *G03F 7/425* (2013.01); *G03F 7/426* (2013.01); *H01L 21/02068* (2013.01)

(58) Field of Classification Search
CPC .................................................... C11D 11/0047
USPC ................................................. 510/175, 176
See application file for complete search history.

(56) References Cited

U.S. PATENT DOCUMENTS

| | | | |
|---|---|---|---|
| 6,054,061 A | 4/2000 | Bayes et al. | |
| 2006/0154839 A1* | 7/2006 | Ilardi | C11D 3/0073 510/175 |
| 2010/0065530 A1* | 3/2010 | Walker | H01L 21/32134 216/13 |
| 2015/0344825 A1 | 12/2015 | Cooper et al. | |
| 2016/0020087 A1 | 1/2016 | Liu et al. | |
| 2016/0185595 A1* | 6/2016 | Chen | H01L 21/02063 216/13 |

FOREIGN PATENT DOCUMENTS

| | | |
|---|---|---|
| EP | 1 577 934 A1 | 9/2005 |
| EP | 1 775 337 A1 | 4/2007 |
| EP | 3 089 200 A1 | 11/2016 |
| TW | 200538544 A | 12/2005 |
| TW | 201209156 A1 | 3/2012 |
| TW | 201631193 A | 9/2016 |

* cited by examiner

*Primary Examiner* — Gregory E Webb

(74) *Attorney, Agent, or Firm* — Entegris, Inc.

(57) ABSTRACT

The disclosure relates to a cleaning composition that aids in the removal of post-etch residues in the production of semiconductors. There is provided a stock composition comprising: a tetraalkylammonium hydroxide base or a quaternary trialkylalkanolamine base; a corrosion inhibitor; and a combination of at least two or more polyprotic acids or salts thereof, wherein at least one said polyprotic acid or salt thereof contains phosphorous.

19 Claims, No Drawings

CLEANING COMPOSITIONS FOR REMOVING POST ETCH RESIDUE

PRIORITY CLAIM

The present non provisional patent Application claims priority under 35 USC § 119(e) from U.S. Provisional Patent Application having Ser. No. 62/426,443, filed Nov. 25, 2016, entitled "CLEANING COMPOSITIONS FOR REMOVING POST ETCH RESIDUE," the entirety of which is incorporated herein by reference.

FIELD OF THE INVENTION

The present disclosure relates to compositions for the removal of post-etch residue and/or titanium-containing hardmask material from microelectronic devices and methods of making and using the same. The compositions may have a high selectivity for titanium-containing materials relative to aluminum nitride and metallic interconnect materials on the microelectronic device.

BACKGROUND

As device nodes shrink below 10 nanometers (nm) in advanced semiconductor manufacturing, new materials are introduced for better device performance and manufacturability. Examples of new materials being considered include cobalt via contacts, aluminum nitride etch stop layers, and titanium nitride barrier layers.

Titanium nitride has various applications in the semiconductor industry, such as hard masks, metal barriers, conductive electrodes, metal gates, and many others. Titanium nitride has good metal diffusion blocking characteristics which is desirable for a barrier material and also has a low resistivity of about 30-70 micro Ohm-cm after annealing. Titanium nitride films can be made by physical vapor deposition and chemical vapor deposition processes.

Post etch cleaning chemistry that is compatible with cobalt, aluminum nitride, and titanium nitride barrier materials enables manufacturing processes at the smaller and more advanced nodes. In the back end of line (BEOL), copper (Cu) is still used as an interconnect metal line, so a cleaning chemistry formulation that is compatible with copper as well as the new materials is advantageous. There is a continuing need for cleaning compositions with controlled etch rate and selectivity for titanium nitride hard mask materials over other films in the device which can include cobalt, copper, aluminum nitride, low-k dielectrics, and titanium nitride barrier materials.

SUMMARY

The problem of post etch residue removal during manufacturing of microelectronic devices utilizing cobalt via contacts, titanium nitride barrier material and copper interconnects, an aluminum nitride etch stop layer, and a titanium nitride hard mask material may be solved by a composition that has a high etch rate selectivity for the titanium nitride hard mask, a controllable but low aluminum nitride etch rate, and low, but substantially equalized, copper and cobalt etch rates. Ideally the composition may also be compatible with low-k dielectric materials.

From one aspect, the invention provides a stock composition comprising: a tetraalkylammonium hydroxide base or a quaternary trialkylalkanolamine base; a corrosion inhibitor; and a combination of at least two or more polyprotic acids or salts thereof, wherein at least one said polyprotic acid or salt thereof contains phosphorous.

Optionally, the combination of at least two or more polyprotic acids or salts thereof may comprise, consist of, or consist essentially of phosphoric acid, a phosphonic acid, or a salt thereof. Suitably, the combination may comprise, consist of, or consist essentially of phosphoric acid, a diphosphonic acid or a combination thereof.

Suitably, the combination of at least two or more polyprotic acids or salts thereof may comprise a polycarboxylic acid or salt thereof. Optionally, the polycarboxylic acid may be a polyamino carboxylic acid. The polycarboxylic acid or salt thereof may for example comprises one or more of oxalic and an alkyldiaminetetraacetic acid. Optionally, the combination of at least two or more polyprotic acids may comprise a plurality of such polycarboxylic acids or salts thereof.

In some versions of the composition the at least two or more polyprotic acids or salts thereof may include an alkyldiaminetetraacetic acid and the phosphorous containing polyprotic acid or salt thereof may be a diphosphonic acid or phosphoric acid. In other versions of the composition at least three or more polyprotic acids or salts thereof may include an alkyldiaminetetraacetic acid and the phosphorous containing polyprotic acid or salt thereof may be a diphosphonic acid or phosphoric acid.

Advantageously, the composition may comprise an oxidizer. The oxidizer may suitably comprise a heterocyclic amine N-oxide.

In some versions of the composition, the tetraalkylammonium hydroxide base or a quaternary trialkylalkanolamine base and oxidizer comprising heterocyclic amine N-oxide together make up between 10 wt % and 35 wt % of the composition.

Optionally, the heterocyclic amine N-oxide may be present in an amount of from 5 wt % to 15 wt %. In various embodiments, the heterocyclic amine N-oxide may comprise, consist of, or consist essentially of 4-ethylmorpholine-N-oxide, N-methyl piperidine-N-oxide, 3-methylpyridine N-oxide, NMMO, or combinations thereof. In various embodiments, the heterocyclic amine N-oxide may comprise, consist of, or consist essentially of NMMO.

The amount of tetraalkylammonium hydroxide base or quaternary trialkylalkanolamine hydroxide base in the composition may suitably be between 5 wt % and 20 wt %.

The base comprising tetraalkylammonium hydroxide may have the formula $[NR_1R_2R_3R_4]OH$, wherein $R_1$, $R_2$, $R_3$ and $R_4$ are the same as or different from one another and are selected from the group consisting of H, and $C_1$-$C_6$ alkyls. The quaternary trialkylalkanolamine hydroxide base may have the formula $[R_1R_2R_3NR_4OH]^+[OH]^+$, wherein $R_1$, $R_2$, $R_3$, and $R_4$ is each a lower alkyl group such as methyl, ethyl, or propyl.

In versions of the composition the corrosion inhibitor may comprise, consist essentially of or consist of 5-methylbenzotriazole, tolyltriazole, benzotriazole, dimethylbenzotriazole, or combinations thereof.

In versions of the composition the corrosion inhibitor may be 5-methylbenzotriazole, tolyltriazole, or a mixture of 5-methylbenzotriazole and tolyltriazole. The amount of corrosion inhibitor in the composition may optionally be between 0.1 wt % to 5 wt %, for example between 0.2 wt % to 5 wt % or between 0.4 wt % to 5 wt %.

The composition may optionally comprise an organic solvent. Suitably, the organic solvent may comprise a polar aprotic solvent. The amount of organic solvent in the composition may, for example, be in the range of from 10 wt % to 30 wt %. In various embodiment, the organic solvent comprises, consists or consists essentially of a glycol ether, for example tetraglyme or butyl carbitol.

Conveniently, the composition may comprise water. The water may make up a balancing amount in the composition. The amount of water in the composition may, for example, be between 60 wt % to 90 wt %.

The pH of the undiluted composition may suitably be between 10 and 14.

One part by weight of the composition may be further combined or diluted with between 0.3 parts and 12 parts of a diluting oxidizer to form a diluted composition. In some versions of the disclosure, the diluting oxidizer is 30 wt % hydrogen peroxide. The pH of the peroxide diluted composition may be between 7 and 14 and in some versions between 10 and 14.

In various embodiments, a stock composition that may be diluted with an oxidizer to provide a diluted composition with a high etch rate selectivity for a titanium nitride hard mask over a titanium nitride barrier material, a controllable aluminum nitride etch rate, and low, but substantially equalized, copper and cobalt etch rates and is compatible with low-k dielectrics may be as hereinabove defined. In various embodiments, the composition may comprise, consist of, or consist essentially of a tetraalkylammonium hydroxide base or a quaternary trialkylalkanolamine base, and an oxidizer comprising a heterocyclic amine N-oxide, a corrosion inhibitor comprising 5-methylbenzotriazole, and a combination of at least two or more polyprotic acids or salts thereof, wherein at least one of the polyprotic acids or salts thereof contains phosphorous.

In another version, a stock composition that may be diluted with an oxidizer to provide a diluted composition with a high etch rate selectivity for a titanium nitride hard mask over a titanium nitride barrier material, a controllable aluminum nitride etch rate, and low, but substantially equalized, copper and cobalt etch rates and is compatible with low-k dielectrics comprises, consists of, or consists essentially of a tetraalkylammonium hydroxide base or a quaternary trialkylalkanolamine base, an oxidizer comprising a heterocyclic amine N-oxide, a corrosion inhibitor comprising 5-methylbenzotriazole, and a combination of at least three or more polyprotic acids or salts thereof, wherein at least one of the polyprotic acids or salts thereof contains phosphorous.

The composition diluted or combined with the diluting oxidizer may be characterized by: an etching rate of a TiN hard mask material film deposited by physical vapor deposition on a substrate at a rate of at least 200 Å/min; an etching rate of a TiN barrier material film deposited on a substrate by chemical vapor deposition process at a rate of less than 100 Å/min; an etching of an AlN layer at a rate of less than 50 Å/min; an etching rate of a copper layer at an etch rate of 2 Å/min or less; an etching rate of a cobalt layer at an etch rate of 2 Å/min or less, or by one or more or any combination of these etching rates. The etch rate of the composition diluted or combined with the diluting oxidizer may be characterized and measured on coupon samples of the materials submerged in a beaker at 50° C. with the composition submerged for: 30 seconds for a TiN hard mask coupon; 30 seconds for a TiN barrier material film coupon; 1 minute for an AlN coupon; and 30 minutes each for copper and cobalt film coupons. The composition and peroxide diluted composition are compatible with low-k dielectric materials.

One version of the disclosure is a composition that comprises, consists of, or consists essentially of a tetraalkylammonium hydroxide base or a quaternary trialkylalkanolamine hydroxide base and an oxidizer comprising a heterocyclic amine N-oxide, the tetraalkylammonium hydroxide and oxidizer together make up between 15 wt % and 30 wt % of the composition; a corrosion inhibitor comprising 5-methylbenzotriazole; and a combination of at least two or more polyprotic acids or salts thereof, in some versions a combination of at least three or more polyprotic acids or salts thereof, each said polyprotic acid or salt selected from the group consisting of oxalic, phosphoric, a diphosphonic acid, cyclohexanediaminetetraacetic acid, and water. The pH of the composition may be between 12 and 14.

This composition may be diluted with between 0.3 parts and 12 parts, in some versions between 3 parts and 10 parts, of an oxidizer such as 30 wt % hydrogen peroxide (i.e. a solution of 30 wt % hydrogen peroxide in water). The composition diluted or combined with the oxidizer may have a pH of between 10 and 14 and may be characterized by: an etching rate of a TiN hard mask material film deposited by physical vapor deposition on a substrate at a rate of at least 200 Å/min; an etching of a TiN barrier material film deposited on a substrate by chemical vapor deposition at a rate of less than 100 Å/min; an etching rate of an AlN material film at a rate of less than 50 Å/min; an etching rate of a copper layer film at an etch rate of 2 Å/min or less; an etching rate of a cobalt layer film at an etch rate of 2 Å/min, or by one or more or any combination of these etching rates. The etch rate of the composition diluted or combined with the oxidizer may be characterized and measured on coupon samples of the materials submerged in a beaker at 50° C. with the composition for: 30 seconds for a TiN hard mask material film coupon; 30 seconds for a TiN barrier material film coupon; 1 minute for an AlN material film coupon; and 30 minutes each for copper and cobalt film coupons. The composition and peroxide diluted composition may be compatible with low-k dielectric materials.

From another aspect, the invention provides a method of removing post-etch residue and/or titanium-containing hardmask material from a microelectronic device, the method comprising contacting a composition according to any aspect or embodiment of the invention with the device. The device may suitably comprise titanium-containing hardmask material and one or more of AlN, Cu, and Co.

From still another aspect, the invention provides the use of a composition according to any aspect or embodiment of the invention for the purpose of removing post-etch residue and/or titanium-containing hardmask material from a microelectronic device whilst minimising AlN etch.

DESCRIPTION

The need for cleaning compositions with high etch rate and selectivity for titanium nitride hard mask materials over other films in a microelectronic device may be met with a composition which includes: a tetraalkylammonium hydroxide base or a quaternary trialkylalkanolamine, optionally an oxidizer comprising a heterocyclic amine N-oxide, a corrosion inhibitor optionally comprising 5-methylbenzotriazole, and a combination of at least two or more polyprotic acids or salts thereof, in some versions three or more polyprotic acids or salts thereof, wherein at least one of the polyprotic acids or salts thereof contains phosphorous. When the composition is diluted with an oxidant like hydrogen peroxide, the diluted composition may have a high etch rate selectivity for the titanium nitride hard mask over the titanium nitride barrier material, a controllable but low aluminum nitride etch rate, and low, but substantially equalized, copper and cobalt etch rates while also being compatible with the low-k dielectric material underlying the hardmask.

The composition in versions of the disclosure contains one or more etchant compounds. In some versions of the disclosure the etchant may include a tetraalkylammonium hydroxide base. More generally the tetraalkylammonium cation may have the formula $[NR_1R_2R_3R_4]^+$, wherein $R_1$, $R_2$, $R_3$ and $R_4$ are the same as or different from one another and are selected from the group consisting of H, $C_1$-$C_6$ alkyls (e.g., methyl, ethyl, propyl, butyl, pentyl, hexyl), $C_6$-$C_{10}$ aryls (e.g., benzyl), and any combination of these. The tetralkylammonium cation in one version may have ($R_1$=$R_2$=$R_3$=$R_4$=$CH_3$). For example, the tetraalkylammonium hydroxide in versions of the disclosure may be of the formula $[NR_1R_2R_3R_4]OH$, wherein $R_1$, $R_2$, $R_3$ and $R_4$ are the same as or different from one another and are selected from the group consisting of H, $C_1$-$C_6$ alkyls. Examples of tetralkylammonium hydroxides may include but are not limited to tetramethylammonium hydroxide, ammonium hydroxide, and combinations of these.

In some versions of the disclosure, the etchant compound may be a quaternary trialkylalkanolamine that has the formula $[R_1R_2R_3NR_4OH]^+[OH]^-$, wherein $R_1$, $R_2$, $R_3$, and $R_4$ is each a lower alkyl group such as methyl, ethyl, or propyl. Choline hydroxide is a quaternary ethanolamine compound according to the above formula where $R_1$, $R_2$, and $R_3$ is each a methyl group and $R_4$ is an ethyl group. Examples of trialkylalkanolamines include but are not limited to, trimethylpropanolamine, triethylethanolamine, dimethylethylethanolamine, diethylmethylethanolamine, dimethylethylpropanolamine, diethylmethylpropanolamine, triethylpropanolamine.

The one or more etchant compounds may optionally constitute between 1 wt % and 20 wt % of the composition. In some versions the one or more etchant compounds may comprise between 5 wt % and 20 wt % of the composition. In other versions the one or more etchant compounds may comprise between 8 wt % and 12 wt % of the composition.

The stock composition in versions of the disclosure may include an oxidizer comprising a heterocyclic amine N-oxide. The heterocyclic amine N-oxide oxidizer may comprise, consist, or consist essentially of 3,5-dimethylpyridine N-oxide, 3-methylpyridine N-oxide, 4-methylmorpholine-4-oxide, 2-methylpyridine N-oxide, N-methyl piperidine-N-oxide, 4-ethylmorpholine-N-oxide and combinations of one or more of these. In some versions the heterocyclic amine N-oxide may be made in-situ using an unoxidized precursor molecule in the presence of an oxidizer. For example, 4-methylmorpholine may be reacted with sufficient oxidizer to form 4-methylmorpholine-4-oxide, N-methylpiperidine may be reacted with an oxidizer to form N-methyl piperidine-N-oxide, and 4-ethylmorpholine may be reacted with sufficient oxidizer to form 4-ethylmorpholine-N-oxide. In some versions the unoxidized precursor may be combined or mixed with the tetraalkylammonium hydroxide or quaternary trialkylalkanolamine, an inhibitor, and two or more polyprotic acids and salts thereof, (in some versions three or more polyprotic acids and salts thereof) to form a stock composition. The amount of heterocyclic amine N-oxide in the stock composition may be between from 1 wt % to 15 wt %. In some versions the amount of heterocyclic amine N-oxide in the stock composition may be between from 8 wt % to 12 wt %. In some versions of the disclosure, the amount of heterocyclic amine N-oxide is high enough that it may also act as a solvent for the stock composition or improve post etch cleaning of sidewall residue in diluted compositions when compared to compositions that are absent or have low concentrations (<1 wt %) of heterocyclic amine N-oxide.

A corrosion inhibitor or corrosion inhibitor system may be used to protect the contact metals such as Cu and Co. The corrosion inhibitor may comprise, consist, or consist essentially of one or more corrosion inhibitors including 5-methylbenzotriazole (mBTA), tolytriazole, which is mixture of the 4- and 5-isomers, or a combination of that includes mBTA and tolytriazole. In some versions the amount of the one or more corrosion inhibitors in the stock composition may be 0.4 wt to 5 wt %. In other versions the amount of the one or more corrosion inhibitors in the stock composition may be 0.5 wt % to 2 wt %. In still other versions the amount of corrosion inhibitor may be 1.3 wt % to 1.5 wt %.

The range for the amount of inhibitor in the stock composition is an amount that provides an essentially inhibitor independent Cu etch rate of 2 Å/min or less, and a cobalt etch rate of 2 Å/min or less, as measured on coupon samples submerged in beaker with a composition of the stock composition diluted with from 3 parts 30% $H_2O_2$ to 10 parts 30% $H_2O_2$ at 50° C. for 30 minutes for a copper coupon and 30 minutes for a cobalt coupon. Also, in this concentration range of inhibitor in the peroxide diluted stock compositions, the copper and cobalt etch rates may be within 1 Å/min or less of each other, in some versions the copper and cobalt etch rates are within 0.25 Å/min or less of each other.

A chelating or metal complexing system of two or more, and in some versions three or more, polyprotic acids and salts thereof, polycarboxylic acids and salts thereof, or combinations of polyprotic and polycarboxylic acids and salts thereof may be used in the stock composition. The polycarboxylic acids may optionally be polyamino polycarboxylic acids. The metal complexing system of the stock composition may comprise, consist, or consist essentially of these acids, their salts, or combinations thereof. In some versions the polyprotic acids and salts thereof, (polyamino) polycarboxylic acids and salts thereof, or combinations of polyprotic and (polyamino) polycarboxylic acids and salts thereof may be selected from the group consisting of alkyldiaminetetraacetic acids such as but not limited to ethylenediaminetetraacetic acid (EDTA) and cyclohexanediaminetetraacetic acid, phosphate salts, phosphoric acid, diphosphonic acids of the formula $(CR_5R_6)((OH)_2P=O)_2$ where $R_5$ and $R_6$ may be the same or different, and any combination of these. In some versions the diphosphonic acids may have the formula $(CR_5R_6)((OH)_2P=O)_2$, where $R_5$ and $R_6$ may be (—H, and —H), or (—H and —OH), or (—$CH_3$ and —OH). In the case where $R_5$ and $R_6$ are (—$CH_3$ and —OH), the bisphosphonic acid may be referred to as etidronic acid or 1-hydroxyethane-1,1-diphosphonic acid (HEDP). Each of the polyprotic acids may have a Kai of 1E-2 or less. In some versions the polyprotic acids, (polyamino) polycarboxylic acids, combinations of these and salts thereof may be oxalic acid, cyclohexanediaminetetraacetic acid, phosphoric acid, and etidronic acid.

One suitable range for the amount of inhibitor in the stock composition is one that provides an inhibitor concentration dependent AlN etch rate that may controllably be varied from about 5 Å/min or less (high concentration of inhibitor) to about 50 Å/min (low concentration ¼× of high concentration of inhibitor). Suitably, high amounts of inhibitor may result in 90% lower AlN etch rate while minimally decreasing the TiN PVD material etch rate by less than 10% compared to a stock composition with a low amount of inhibitor. Versions of the stock composition may be prepared that when diluted with 4 parts by weight of 30 wt % hydrogen peroxide, may have an AlN etch rate that varies with the amount of a polyprotic acid that contains phosphorous. The AlN etch rate may be less than 5 Å/min, (for example 0 Å/min, 1 Å/min, 2 Å/min, 3 Å/min, 4 Å/min) when a 4× amount of a polyprotic acid that contains phosphorous is present; the AlN etch rate may be less than 10 Å/min when a 3× amount of a polyprotic acid that contains phosphorous is present; the AlN etch rate may be less than 25 Å/min when a 2×, amount of a polyprotic acid that contains phosphorous is present; and the AlN etch rate may be about 50 Å/min or less when a 1× amount of a polyprotic acid that contains phosphorous is present. Without the polyprotic acid that contains phosphorous, the AlN etch rate may be about 125 Å/min. A low AlN etch rate enables removal of the TiN hard mask with minimal etching of the AlN.

The amount of the polyprotic acids, salts of the polyprotic acids, (polyamino) polycarboxylic acids and salts thereof, or combination thereof in the stock composition is greater than zero weight percent and may optionally be less than 1 wt %. In some versions the amount of the polyprotic acids, salts of polyprotic acids, (polyamino) polycarboxylic acids and salts thereof, or combination thereof in the stock composition is between 0.1 wt % and 3 wt %, for example between 0.1 wt % and 1 wt %. In other versions the amount of the polyprotic acids, salts of acids, polyamino polycarboxylic acids and salts thereof, or combination thereof in the stock composition is between 0.15 wt % and 0.85 wt %. The concentration of phosphorous containing polyprotic acid(s) or salts thereof in the stock composition may be greater than 0.15 wt %. In some versions the concentration of phosphorous containing polyprotic acid(s) or salts thereof in the stock composition may be between 0.15 wt % and 0.7 wt %. Amounts of phosphorous containing polyprotic acid(s) or salts thereof in the stock composition may be greater than 0.7 wt % in compositions that are recirculated in a process tool. In versions of the stock composition, the amount of polyprotic acids or acid salts in weight percent is less than the amount of inhibitor in weight percent.

The stock composition may be diluted with additional diluting oxidizer, e.g. above the 5 wt % to 15 wt % amount of heterocyclic amine N-oxide, to form a dilute composition. The dilute composition may for example be made by adding hydrogen peroxide to the stock composition. For example, dilute compositions may be made by mixing 1 part of the stock composition with between from 0.3 parts of 30% (w/w) $H_2O_2$ up to 12 parts 30% $H_2O_2$. In some versions the stock solution may be diluted by mixing 1 part of the stock composition with between from 3 parts of 30% (w/w) $H_2O_2$ up to 10 parts 30% (w/w) $H_2O_2$.

In versions of the disclosure, the etchant composition comprises, consists, or consists essentially of a tetraalkylammonium hydroxide or a quaternary trialkylalkanolamine base in an amount of from 5 wt % to 20 wt % of the composition, and an oxidizer comprising, consisting, or consisting essentially of a heterocyclic amine N-oxide in an amount of from 5 wt % to 15 wt % of the composition and together make up between 10 wt % and 35 wt % of the composition.

In some versions of the composition, the tetraalkylammonium hydroxide base or quaternary trialkylalkanolamine base and oxidizer comprising a heterocyclic amine N-oxide together make up between 15 wt % and 30 wt % of the composition.

The corrosion inhibitor system comprising, consisting, or consisting essentially 5-methylbenzotriazole may be 0.4 wt % to 2 wt % of the composition, the chelating system of two, and in some versions three, or more polyprotic acids, salts of polyprotic acids, polyamino polycarboxylic acids and salts thereof may be 0.1 wt % to 1 wt % of the composition. The balance of the stock composition may be water. In versions of the stock composition, the amount of water may range from about 60 wt % to about 90 wt % of the composition, in other versions of the stock composition the amount of water in the stock composition may range from 62 wt % to 87 wt %, and in still other versions the amount of water in the stock composition may range from 70 wt % to 82 wt %.

Salts of acids may be inorganic such as but not limited to sodium, potassium, calcium, lithium magnesium, ammonium, or organic such as tetralkylammonium as described above. When a component in the stock composition is a salt, the salt may be hydrated or anhydrous.

Water may comprise from about 60 wt % to about 90 wt % of the stock composition prior to dilution with an oxidant composition such as 30 wt % or 50 wt % hydrogen peroxide.

The pH of the stock composition may be 10 or higher, in some versions a pH of 12 or higher, and is still other versions a pH of approximately 14, or a pH of 14. The pH of the stock composition diluted with a peroxide like hydrogen peroxide (30 wt % $H_2O_2$ in water) may be 8 or higher, in some versions the pH of the stock composition diluted with a peroxide like hydrogen peroxide (30 wt % $H_2O_2$) is 10 or higher. In still other versions, the pH of the stock composition diluted with a peroxide like hydrogen peroxide (30 wt % $H_2O_2$ in water) may be 12 or higher. In yet still other versions, the pH of the stock composition diluted with a peroxide like hydrogen peroxide (30 wt % $H_2O_2$ in water) may be between 12 and 14.

The stock composition may be mixed with hydrogen peroxide or other strong oxidizer to form a composition that may be used for post etch residue removal. For example, one part of the stock composition may for example be diluted with from 3 parts of oxidizer to 10 parts of oxidizer. In one version of the disclosure, one part of the stock composition may for example be diluted with from 3 parts of 30% $H_2O_2$ to 10 parts of 30% $H_2O_2$ to form a diluted cleaning composition. The diluted cleaning composition may be used for post etch residue removal. The oxidizing agent may be mixed with the stock composition at the manufacturer in bulk, or by chemical blending just prior to contacting of the diluted composition with the device on a substrate.

The stock compositions and diluted cleaning compositions in versions of the disclosure are stable and do not phase separate, they are homogenous and the components completely miscible. The stock composition or diluted stock composition may be prepared by mixing the various components by weight using a laboratory scale. These compositions may be used to remove post etch residues from wafers that include a PVD TiN hardmask, an AlN stop etch layer along with copper interconnect line and a cobalt via contact, and a CVD TiN barrier material.

The at least one organic solvent may comprise at least one water-miscible organic solvent. The organic solvent and water may optionally form a solvent system of water and organic solvent that together make up between about 60 wt % and about 90 wt % of the composition. Suitable solvents include, for example, glycol ethers. In some versions, the organic solvent comprises, consists of or consists essentially of tetraglyme.

The TiN hardmask material, TiN barrier material, AlN etch stop material, cobalt and copper may include non-stoichimetric materials such as $TiN_x$. These non-stoichiometric film materials may be formed during deposition. Other impurities such as carbon, oxygen, and silicon may also be present in these materials. The compositions, etch rate coupon test characterization, and methods of treating microelectronic devices described herein may be used to treat the stoichiometric or non-stoichiometric materials.

One version of the disclosure is a method of removing post-plasma etch residue and/or hardmask material from a microelectronic device having the residue and/or hardmask thereon, the method comprising contacting the microelectronic device with a stock composition diluted with an oxidant like (for example) hydrogen peroxide for sufficient time to at least partially clean said residue and/or hardmask from the microelectronic device.

The stock composition may be as described in relation to any aspect or embodiment herein. For example, the stock solution diluted with the oxidant may includes a tetraalkylammonium hydroxide base, at least one amine-N-oxide oxidizer, an inhibitor comprising 5-methylbenzotriazole, a chelating system of two or more polyprotic acids or salts thereof, and water, wherein the pH of the oxidant diluted composition is in a range from about 10 to about 14. The method may include contacting peroxide diluted composition with a substrate having one or more microelectronic devices with TiN hardmask under conditions selected from the group consisting of a contact time in a range from about 1 minute to about 60 minutes; a temperature of the oxidant diluted composition in a range of from about 30° C. to about 70° C.; and combinations thereof. The microelectronic device may include a layer selected from the group consisting of a titanium-containing layer, a low-k dielectric layer, copper interconnects, cobalt, and an aluminum containing etch stop layer such as AlN, and combinations thereof. The method may include contacting the oxidant diluted composition by a process selected from the group consisting of: spraying the oxidant diluted composition on a surface of the microelectronic device; dipping the microelectronic device in a sufficient volume of the oxidant diluted composition; contacting a surface of the microelectronic device with another material that is saturated with the oxidant diluted composition; and contacting the microelectronic device with a circulating bath of the oxidant diluted composition.

Without wishing to be bound by theory the combination of acids or their salts stabilizes the oxidizer, removes redeposited Cu left behind by the etch process and also protects the etch stop material AlN which slows and enables control of the etch stop layer from the device.

Versions of the primary cleaning composition include an etchant like TMAH and oxidizer like NMMO that together with other components selectively remove a PVD deposited TiN layer at high etch rate compared to chemical vapor deposited TiN materials, AlN layer, as well as copper and cobalt materials used for interconnects. In addition to the etchant and oxidizer, the primary cleaning composition includes a corrosion inhibitor mixture that protects the Cu and Co and a chelating agent mixture that stabilizes the oxidizer, removes redeposited Cu left behind by the etch process and slows/controls the removal of etch stop material from the device.

Example 1

A stock reference composition, TitanKlean® 9C (TK9C) available from Entegris Inc, Billerica Mass., was used as a reference dilute cleaning composition. Nine (9) parts of 30% $H_2O_2$ were added to one (1) part of the TK9C composition to make the reference dilute cleaning composition TK9C ($H_2O_2$).

A further stock composition that comprised a tetraalkylammonium hydroxide base and an oxidizer comprising a heterocyclic amine N-oxide (the tetraalkylammonium hydroxide and oxidizer together made up between 15 wt % and 30 wt % of the composition); a corrosion inhibitor comprising 5-methylbenzotriazole; and a combination of at least two or more polyprotic acids or salts selected from oxalic, phosphoric, a diphosphonic acid, cyclohexanediaminetetraacetic acid, and water were diluted into 4 parts of 30 wt % hydrogen peroxide. The amount of water in the stock composition was from 70 wt % to 82 wt %.

The etch rate of the peroxide diluted stock solution and the reference dilute composition TK9C($H_2O_2$) on TiN, AlN, Cu, and Co were measured on coupon samples having coatings of these materials. The coupon sample was submerged in a beaker containing the dilute cleaning composition heated to 50° C. The coupon samples were submerged for 30 seconds for TiN coupon (PVD or CVD), for 1 minute for an AlN coupon, and 30 minutes for the copper and cobalt coupons. The coupon film etch rates were measured using (x-ray fluorescence) XRF for the AlN, Cu, and Co coupons, and Ellipsometry for the TiN coupons.

The PVD TiN and AlN etch rates of the TK9C($H_2O_2$) and representative peroxide diluted stock composition were evaluated. The etch rate result for representative peroxide diluted stock cleaning compositions were evaluated with 1×, 2×, 3×, and 4× amounts of added AlN inhibitor (phosphate).

The test results show a high AlN etch rate, >100 Å/min for the TK9C($H_2O_2$) composition (no added phosphate).

Phosphate compound was added to the peroxide diluted stock solution and was observed to control AlN etch rate. AlN etch rate was well controlled by AlN inhibitor amount while the other film's etch rate did not change. The etch rate of AlN varied depending upon the concentration of the inhibitor. The AlN etch rate was observed to be less than 5 Å/min when a 4×, concentration of inhibitor was used; the AlN etch rate was observed to be less than 10 Å/min when a 3×, concentration of inhibitor was used; the AlN etch rate was observed to be less than 25 Å/min when a 2×, concentration of inhibitor was used; and the AlN etch rate was observed to be about 50 Å/min or less when a 1× concentration of inhibitor was used. Without the inhibitor the AlN etch rate was about 125 Å/min.

The PVD TiN etch rate was between about 200 Å/min and 250 Å/min for both the TK9C($H_2O_2$) composition (no added phosphate) and the peroxide diluted stock solution with between 1× and 4× amounts of phosphate inhibitor.

The observed selectivity for TiN deposited by PVD over a TiN material deposit by CVD was 1:2 to 1:3 or between about 65 Å/min to 100 Å/min to between about 100 Å/min to 150 Å/min for the peroxide diluted stock solution with between 1× and 4× amounts of phosphate inhibitor.

These formulations gave a copper etch rate of 2 Å/min or less and a cobalt etch rate of 2 Å/min. The where the copper and cobalt etch rates were observed to be between about 0.25 Å/min and 0.5 Å/min of each other for the peroxide diluted stock solution with between 1× and 4× amounts of phosphate inhibitor.

Example 2

Comparative stock compositions (CE-1, CE-2 and CE-3), and fourteen example stock compositions (E 1-14) were prepared as per Table 1:

TABLE 1

| Sample ID | DIW | TMAH | TMAF 20% | NMMO | Tetraglyme | Butyl Carbitol | 5m-BTA | CDTA | oxalic acid | $H_3PO_4$ | DAP |
|---|---|---|---|---|---|---|---|---|---|---|---|
| CE-1 | 80.06 | 8.40 | — | 10.00 | — | — | 1.40 | 0.01 | 0.13 | — | — |
| E-1 | 79.96 | 8.40 | — | 10.00 | — | — | 1.40 | 0.01 | 0.13 | 0.10 | — |
| E-2 | 79.86 | 8.40 | — | 10.00 | — | — | 1.40 | 0.01 | 0.13 | 0.20 | — |
| E-3 | 79.66 | 8.40 | — | 10.00 | — | — | 1.40 | 0.01 | 0.13 | 0.40 | — |
| E-4 | 79.26 | 8.40 | — | 10.00 | — | — | 1.40 | 0.01 | 0.13 | 0.80 | — |
| CE-2 | 72.29 | 7.00 | — | — | 20.00 | — | 0.70 | 0.01 | — | — | — |
| E-5 | 70.78 | 7.00 | — | — | 20.00 | — | 0.70 | 0.01 | — | 1.51 | — |
| E-6 | 69.24 | 7.00 | — | — | 20.00 | — | 0.70 | 0.01 | — | 2.35 | — |
| E-7 | 68.59 | 7.00 | — | — | 20.00 | — | 0.70 | 0.01 | — | 3.00 | — |
| CE-3 | 62.99 | 4.00 | 2.65 | — | — | 30.00 | 0.35 | 0.01 | — | — | — |
| E-8 | 62.94 | 4.00 | 2.65 | — | — | 30.00 | 0.35 | 0.01 | — | — | 0.05 |
| E-9 | 62.74 | 4.00 | 2.65 | — | — | 30.00 | 0.35 | 0.01 | — | — | 0.25 |
| E-10 | 62.49 | 4.00 | 2.65 | — | — | 30.00 | 0.35 | 0.01 | — | — | 0.50 |
| E-11 | 61.99 | 4.00 | 2.65 | — | — | 30.00 | 0.35 | 0.01 | — | — | 1.00 |
| E-12 | 61.49 | 4.00 | 2.65 | — | — | 30.00 | 0.35 | 0.01 | — | — | 1.50 |
| E-13 | 60.99 | 4.00 | 2.65 | — | — | 30.00 | 0.35 | 0.01 | — | — | 2.00 |
| E-14 | 59.99 | 4.00 | 2.65 | — | — | 30.00 | 0.35 | 0.01 | — | — | 3.00 |

DIW: deionized water
TMAH: Tetramethylammonium hydroxide
TMAF: Tetramethylammonium fluoride (20% aqueous solution)
NMMO: N-methylmorpholine oxide
5m-BTA: 5-methyl-benzotriazole
CDTA: cyclohexanediaminetetraacetic acid
DAP: Diammonium phosphate The compositions were diluted with $H_2O_2$ at a ratio of 1:9 or 1:4 (composition: $H_2O_2$) as set out in Table 2 below. The etch rates of the diluted compositions on TiN, AlN, Cu, and Co were measured on coupon samples having coatings of these materials. The coupon sample was submerged in a beaker containing the dilute cleaning composition and heated to 50° C. and stirred at 360 rpm. The coupon samples were submerged for 30 seconds for TiN coupon (formed by physical vapor deposition), for 1 minute for an AlN coupon, and 30 minutes for the copper and cobalt coupons. The coupon film etch rates were measured using (x-ray fluorescence) XRF for the AlN, Cu, and Co coupons, and Ellipsometry for the TiN coupons. The results are shown in Table 2:

TABLE 2

| | Dilution Chemical: | Etch Rate [Å/min] | | | |
|---|---|---|---|---|---|
| Sample ID | $H_2O_2$ (30%) | PVD TiN (30 sec) | AlN (1 min) | Cu (30 min) | Co (30 min) |
| CE-1 | 1:9 | 249 | 64.5 | 0.8 | 0.1 |
| E-1 | 1:9 | 259 | 12.0 | 0.8 | 0.0 |
| E-2 | 1:9 | 294 | 4.0 | 0.8 | 0.0 |
| E-3 | 1:9 | 291 | 2.6 | 0.8 | 0.0 |
| E-4 | 1:9 | 258 | 2.0 | 0.8 | 0.0 |
| CE-2 | 1:4 | 250 | 129 | 1.4 | 0.0 |
| E-5 | 1:4 | 245.6 | 24.5 | 1.7 | 0.0 |
| E-6 | 1:4 | 228.0 | 5.0 | 1.3 | 0.0 |
| E-7 | 1:4 | 210.9 | 2.0 | 1.2 | 0.0 |

TABLE 2-continued

| | Dilution Chemical: | Etch Rate [Å/min] | | | |
|---|---|---|---|---|---|
| Sample ID | $H_2O_2$ (30%) | PVD TiN (30 sec) | AlN (1 min) | Cu (30 min) | Co (30 min) |
| CE-3 | 1:4 | 274 | 81 | 0.8 | 0.04 |
| E-8 | 1:4 | 240 | 75.5 | — | 0.08 |
| E-9 | 1:4 | 256 | 33.5 | — | 0.04 |
| E-10 | 1:4 | 294 | 17 | — | 0.13 |
| E-11 | 1:4 | 316 | 9.5 | — | 0.08 |
| E-12 | 1:4 | 320 | 6.5 | — | 0.1 |
| E-13 | 1:4 | 372 | 12.5 | 1.9 | 0.13 |
| E-14 | 1:4 | 400 | 8 | 1.9 | 0.19 |

The PVD TiN etch rate was between about 200 Å/min and 400 Å/min for all the compositions. Copper and cobalt etch rates were observed to be consistently low or absent.

AlN etch rate was controlled by the addition of phosphoric acid while the other etch rates did not change significantly.

The results show that the effect of phosphoric acid on AlN etch rates is also seen when tetraglyme or Butyl Carbitol is used as an organic solvent and in the absence of the oxidizer NMMO.

Example 3

This example illustrates the preparation of further stock cleaning compositions E 15-17 that were prepared by mixing reagents by weight percent as shown in Table 3:

TABLE 3

| ID | DIW (wt %) | TAAH (wt %) | Heterocyclic amine oxide (wt %) | Polyprotic acid or salt (1) | Polyprotic acid or salt (2) | Phosphorus containing acid or salt (1) | Phosphorus containing acid or salt (2) | mBTA (wt %) |
|---|---|---|---|---|---|---|---|---|
| E-15 | 79.8 | 8.4 | 10 | ≤0.1 | 0.1 | 0.2 | 0 | 1.4 |
| E-16 | 72.8 | 15 | 10 | ≤0.1 | 0.1 | 0 | 0.6 | 1.4 |
| E-17 | 79.9 | 8.4 | 10 | ≤0.1 | 0 | 0.2 | 0 | 1.4 |

The specific formulations of compositions E 15-17 and additional compositions E 18-21 are shown in Table 4:

TABLE 4

| | Formulation (wt %) | | | | | | | |
|---|---|---|---|---|---|---|---|---|
| ID | DIW | TMAH | NMMO | CDTA | Oxalic acid | $H_3PO_4$ | HEDP | 5m-BTA |
| E-15 | 79.86 | 8.40 | 10.00 | 0.01 | 0.13 | 0.20 | — | 1.40 |
| E-16 | 72.83 | 15.00 | 10.00 | 0.01 | 0.13 | — | 0.63 | 1.40 |
| E-17 | 79.99 | 8.40 | 10.00 | 0.01 | — | 0.20 | — | 1.40 |
| E-18 | 71.96 | 14.50 | 10.00 | 0.01 | 0.13 | 2.00 | — | 1.40 |
| E-19 | 72.83 | 15.00 | 10.00 | 0.01 | 0.13 | — | 0.63 | 1.40 |
| E-20 | 73.30 | 15.00 | 10.00 | 0.01 | 0.13 | — | 0.16 | 1.40 |

DIW: deionized water
TMAH: Tetramethylammonium hydroxide
NMMO: N-methylmorpholine oxide
CDTA: cyclohexanediaminetetraacetic acid
HEDP: 1-Hydroxyethane-1,1,-diphosphonic acid
5m-BTA: 5-methyl-benzotriazole The compositions were diluted with $H_2O_2$ at a ratio of 1:9 or 1:4 (composition: $H_2O_2$) as set out in Table 5 below. The etch rates of the diluted compositions on TiN, AlN, Cu, and Co were measured on coupon samples having coatings of these materials. The coupon sample was submerged in a beaker containing the dilute cleaning composition heated to 50° C. The coupon samples were submerged for 30 seconds for TiN coupon (formed by physical vapor deposition), for 1 minute for an AlN coupon, and 30 minutes for the copper and cobalt coupons. The coupon film etch rates were measured using (x-ray fluorescence) XRF for the AlN, Cu, and Co coupons, and Ellipsometry for the TiN coupons. The results are shown in Table 5:

TABLE 5

| | Dilution Chemical: | Etch Rate [A/min] | | | |
|---|---|---|---|---|---|
| Sample ID | $H_2O_2$ (30%) | PVD TiN (30 sec) | AlN (1 min) | Cu (30 min) | Co (30 min) |
| E-15 | 1:9 | 297 | 8 | 0.8 | 0.0 |
| E-16 | 1:9 | 288 | 6 | 1.2 | 0.2 |
| E-17 | 1:9 | 301 | 8 | 0.8 | 0.0 |
| E-18 | 1:9 | 274.7 | 4.5 | 1.13 | 0.02 |
| E-19 | 1:9 | 228.00 | 3.50 | 1.07 | 0.03 |
| E-20 | 1:9 | 301.35 | 12.00 | 0.94 | 1.98 |

The results show that composition E-6 prepared with a bisphosphonate instead of phosphoric acid showed a particularly low AlN etch rate, albeit with slightly increased Cu and Co etch rates.

The compositions in versions of the disclosure may be used for a post etch residue removal cleaning process where for example a PVD deposited TiN hardmask (HM) and post etch residues are removed from a substrate that includes: a low-k dielectric material underlying the TiN HM, an AlN etch stop layer, copper interconnects, cobalt via contacts, and chemical vapor deposited TiN barrier material (BM). Compositions and compositions diluted with an oxidant in versions of the disclosure are compatible with the low-k dielectric material, remove the post etch residues, have a high TiN HM etch rate and have high etch selectivity over the TiN BM, AlN, the copper, and the cobalt materials.

While various compositions and methods are described, it is to be understood that this invention is not limited to the particular molecules, compositions, designs, methodologies or protocols described, as these may vary. It is also to be understood that the terminology used in the description is for the purpose of describing the particular versions or embodiments only, and is not intended to limit the scope of the present invention which will be limited only by the appended claims.

It must also be noted that as used herein and in the appended claims, the singular forms "a", "an", and "the" include plural reference unless the context clearly dictates otherwise. Thus, for example, reference to a "chelating agent" may be a reference to one or more chelating agents and equivalents thereof known to those skilled in the art, and so forth. Unless defined otherwise, all technical and scientific terms used herein have the same meanings as commonly understood by one of ordinary skill in the art. Methods and materials similar or equivalent to those described herein can be used in the practice or testing of embodiments of the present invention. All publications mentioned herein are incorporated by reference in their entirety. Nothing herein is to be construed as an admission that the invention is not entitled to antedate such disclosure by virtue of prior invention. "Optional" or "optionally" or "advantageously" or "suitably" means that the subsequently described event or circumstance may or may not occur, and that the description includes instances where the event occurs and instances where it does not. All numeric values herein can be modified by the term "about," whether or not explicitly indicated. The term "about" generally refers to a range of numbers that one of skill in the art would consider equivalent to the recited value (i.e., having the same function or result). In some embodiments the term "about" refers to ±10% of the stated value, in other embodiments the term "about" refers to ±2% of the stated value. While compositions and methods are described in terms of "comprising" various components or steps (interpreted as meaning "including, but not limited to"), the compositions and methods can also "consist essentially of" or "consist of" the various components and steps. Thus such terminology should be interpreted as defining essentially closed or closed member groups in some embodiments.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The invention claimed is:

1. A stock composition comprising:
   a tetraalkylammonium hydroxide base or a quaternary trialkylalkanolamine base;
   a corrosion inhibitor; and
   a combination of at least two or more polyprotic acids or salts thereof, wherein at least one said polyprotic acid or salt thereof contains phosphorous,
   wherein the stock composition has a pH of greater than 10.

2. The composition of claim 1, wherein said combination of at least two or more polyprotic acids or salts thereof comprises phosphoric acid, a phosphonic acid, or a salt thereof.

3. The composition of claim 1, wherein said combination of at least two or more polyprotic acids or salts thereof comprises phosphoric acid, a diphosphonic acid or a combination thereof.

4. The composition of claim 1, wherein said combination of at least two or more polyprotic acids or salts thereof comprises a polycarboxylic acid or salt thereof.

5. The composition of claim 4, wherein the polycarboxylic acid or salt thereof comprises one or more of oxalic and an alkyldiaminetetraacetic acid.

6. The composition of claim 1 comprising an oxidizer comprising a heterocyclic amine N-oxide.

7. The composition of claim 6, wherein the tetraalkylammonium hydroxide base or a quaternary trialkylalkanolamine base and oxidizer comprising heterocyclic amine N-oxide together make up between 10 wt % and 35 wt % of the composition.

8. The composition of claim 6, wherein the heterocyclic amine N-oxide is present in an amount of from 5 wt % to 15 wt %.

9. The composition of claim 6, wherein the heterocyclic amine N-oxide comprises 4-ethylmorpholine-N-oxide, N-methyl piperidine-N-oxide, 3-methylpyridine N-oxide, NMMO, or a combination thereof.

10. The composition of claim 1, wherein the amount of tetraalkylammonium hydroxide base or quaternary trialkylalkanolamine base in the composition is between 5 wt % and 20 wt %.

11. The composition of claim 1, wherein the tetraalkylammonium hydroxide base has a formula $[NR_1R_2R_3R_4]OH$, wherein $R_1$, $R_2$, $R_3$ and $R_4$ are the same as or different from one another and are selected from the group consisting of H, and $C_1$-$C_6$ alkyls and the quaternary trialkylalkanolamine has a formula $[R_1R_2R_3NR_4OH]^+[OH]^-$, wherein $R_1$, $R_2$, $R_3$, and $R_4$ is each a lower alkyl group such as methyl, ethyl, or propyl.

12. The composition of claim 1, wherein the corrosion inhibitor comprises 5-methylbenzotriazole, tolyltriazole, benzotriazole, dimethylbenzotriazole, or a combination thereof.

13. The composition of claim 12, wherein the amount of corrosion inhibitor is between 0.1 wt % to 5 wt %.

14. The composition of claim 1, comprising an organic solvent.

15. The composition of claim 14, wherein the solvent comprises a glycol ether and the amount of said solvent in the composition is in the range of from 10 wt % to 30 wt %.

16. The composition of claim 1, comprising a balancing amount of water.

17. A diluted composition comprising one part by weight of claim 1 diluted with between 3 parts and 12 parts of a diluting oxidizer.

18. The diluted composition of claim 17, wherein the diluting oxidizer comprises 30 wt % hydrogen peroxide.

19. A method of removing post-etch residue and/or titanium-containing hardmask material from a microelectronic device, the method comprising contacting a composition according to claim 1 with the device, the device optionally comprising titanium-containing hardmask material and one or more of AlN, Cu, and Co.

* * * * *